(12) United States Patent
Mazzoni et al.

(10) Patent No.: US 7,269,208 B2
(45) Date of Patent: Sep. 11, 2007

(54) DEVICE FOR SENDING/RECEIVING DIGITAL DATA CAPABLE OF PROCESSING DIFFERENT BIT RATES, IN PARTICULAR IN A VDSL ENVIRONMENT

(75) Inventors: Simone Mazzoni, Grenoble (FR); Héléne Came, Grenoble (FR)

(73) Assignee: STMicroelectronics SA, Montrouge (FR)

(*) Notice: Subject to any disclaimer, the term of this patent is extended or adjusted under 35 U.S.C. 154(b) by 873 days.

(21) Appl. No.: 10/088,387

(22) PCT Filed: Jul. 11, 2001

(86) PCT No.: PCT/FR01/02243

§ 371 (c)(1),
(2), (4) Date: Jul. 16, 2002

(87) PCT Pub. No.: WO02/07324

PCT Pub. Date: Jan. 24, 2002

(65) Prior Publication Data

US 2003/0021338 A1  Jan. 30, 2003

(30) Foreign Application Priority Data

Jul. 18, 2000 (FR) .................................... 00 09409

(51) Int. Cl.
H04B 1/38 (2006.01)
H04L 5/16 (2006.01)

(52) U.S. Cl. ..................................................... 375/219

(58) Field of Classification Search ................ 375/219, 375/222, 259, 377; 714/701, 702, 761, 762, 714/763
See application file for complete search history.

(56) References Cited

U.S. PATENT DOCUMENTS

| | | | | |
|---|---|---|---|---|
| 4,559,625 A * | 12/1985 | Berlekamp et al. | ......... | 714/701 |
| 5,751,741 A * | 5/1998 | Voith et al. | ................. | 714/758 |
| 5,764,649 A * | 6/1998 | Tong | .......................... | 714/701 |
| 5,912,898 A * | 6/1999 | Khoury | ...................... | 714/701 |
| 6,956,872 B1 * | 10/2005 | Djokovic et al. | ........... | 370/505 |

FOREIGN PATENT DOCUMENTS

EP  0856949  8/1998

OTHER PUBLICATIONS

Veithen et al., A 70MB/S Variable-Rate DMT-Based Modem for VDSL, IEEE International Solid State Circuits Conference, IEEE Inc. New York, US, vol. 42, Feb. 1999, pp. 248-249, XP000862325.
Patent Abstracts of Japan, vol. 1997, No. 02, Feb. 28, 1997 & JP 08265177 Oct. 11, 1996.

* cited by examiner

*Primary Examiner*—David C. Payne
*Assistant Examiner*—Nader Bolourchi
(74) *Attorney, Agent, or Firm*—Lisa K. Jorgenson; Allen, Dyer, Doppelt, Milbrath & Gilchrist, P.A.

(57) ABSTRACT

A device for sending/receiving digital data is capable of processing different bit rates from a group of predetermined bit rates. The device may include a channel coding/decoding stage including an interleaver, a deinterleaver, and a memory whose minimum size is fixed as a function of the maximum bit rate of the group of predetermined bit rates. The memory may have a first memory space assigned to the interleaver and a second memory space assigned to the deinterleaver. The size of each of the two memory spaces may be set as a function of the bit rate actually processed by the device.

15 Claims, 7 Drawing Sheets

DEVICE FOR SENDING/RECEIVING DIGITAL DATA CAPABLE OF PROCESSING DIFFERENT BIT RATES, IN PARTICULAR IN A VDSL ENVIRONMENT

FIELD OF THE INVENTION

The present invention relates to the field of telecommunications, and, more particularly, to transmitters and receivers for data communication lines. Moreover, the invention relates to sending and receiving digital data that can have different bit rates, and to choosing the capacity of memory means used by interleaving and deinterleaving processes effected within send/receive devices capable of processing different bit rates.

BACKGROUND OF THE INVENTION

The present invention may advantageously be applied to a very high rate digital subscriber line (VDSL) environment or system, for example, though the invention may also be used in other applications. That is, the invention applies to a digital communication system linking an operator and users via very high bit rate transmission lines. Thus, the invention applies more particularly to send/receive devices, usually referred to as modems, at the operator and user ends of a transmission line.

Those skilled in the art will appreciate that a VDSL communication system is capable of delivering symmetrical services and asymmetrical services. A service is symmetrical if the bit rate of information exchanged between the operator and the user in both transmission directions (i.e., from the operator to the user and from the user to the operator) is exactly the same. A service is asymmetrical if the bit rate of information sent in one transmission direction is different from the bit rate of information sent in the other transmission direction.

The processes of interleaving and deinterleaving data sent and received by a modem necessitates the use of memories. For a modem intended to operate at a predetermined bit rate, the memories must have a capacity that depends on that bit rate.

SUMMARY OF THE INVENTION

An object of the invention is to provide a send/receive device (i.e., modem) architecture which requires a reduced quantity of memory.

Yet another object of the invention is to provide such an architecture which can be used at the operator end or at the user end of a transmission line (i.e., which is fully interchangeable between sending and receiving).

Still another object of the invention is to provide such an architecture which is adaptable, particularly in terms of the memory capacity of the interleaving and deinterleaving means, to suit a number of different bit rates selected from a predetermined group of bit rates.

These and other objects, features, and advantages are provided by a memory means whose size is optimized for a global (send+receive) bit rate, which can be shared between the interleaving means and the deinterleaving means, and whose memory allocation can be reconfigured in accordance with the bit rate actually processed by the send/receive device (modem). The invention therefore provides a device for sending/receiving digital data that is capable of processing different bit rates from a group of predetermined bit rates (e.g., all the symmetrical or asymmetrical services offered by the VDSL communication system).

The device according to the invention may include a coding/decoding stage (generally referred to by those skilled in the art as a "channel coding/decoding stage") including interleaving means and deinterleaving means. The interleaving and deinterleaving means include a memory whose minimum size is fixed as a function of the maximum bit rate of the group of predetermined bit rates (e.g., the highest asymmetrical bit rate in the case of a VDSL system). The memory also has a first memory space assigned to the interleaving means and a second memory space assigned to the deinterleaving means. The size of each of the two memory spaces is set as a function of the bit rate actually processed by the device. In the context of the present invention, the term "bit rate" as associated with a memory capacity or memory space is a global bit rate, i.e., the sum of the send and receive bit rates.

It is therefore possible to considerably reduce the size of the memory means required for the interleaving and deinterleaving means implemented within a modem. The modem may be used either at the operator end or at the user end, and it is capable of processing a number of different and symmetrical or asymmetrical bit rates.

The transmitted data stream may be protected from transmission channel noise by a Reed-Solomon coding algorithm, which is well known in the art. To make the Reed-Solomon coding more efficient, the coding means may be coupled to the interleaving means to distribute in time errors introduced by the transmission channel. These errors often occur in bursts and affect several successive bytes, which can reduce the correction capacity of the Reed-Solomon code in isolation (generally eight bytes per packet). The interleaving means may then interleave the bytes temporally by modifying the order in which they are transmitted, which achieves the temporal distribution of the errors.

More specifically, the channel coding/decoding stage may include Reed-Solomon coding/decoding means of length N (where N=240 bytes, for example). The interleaving means are then adapted to effect convolutional interleaving of I branches with i—1 blocks of N bytes. The deinterleaving means are adapted to implement convolutional deinterleaving with I' branches of i'—1 blocks of M' bytes. I and I' are sub-multiples of N, and i and i' are the current relative indexes of the branches. The size in bytes of the first memory space is equal to $I \times (I-1) \times M/2$, and the size in bytes of the second memory space is equal to $I' \times (I'-1) \times M'/2$. The sizes of the two memory spaces are set by I, I', M and M'.

Using convolutional triangular interleaving (and, consequently, convolutional triangular deinterleaving) instead of other conventional types of interleaving is particularly beneficial because it reduces latency generated by the memory. Convolutional triangular interleaving requires a much smaller memory, which reduces latency. Latency is a primordial and decisive criterion for any VDSL communication system.

The memory may be a random access memory, such as a dual-port memory, for example. The interleaving means and the deinterleaving means may respectively include first addressing means and second addressing means. The first and second addressing means may each include a first counter defining the relative index i or i' of a branch, and a second counter defining the number of bytes in a block and incremented each time that the first counter reaches its counting limit value. Moreover, the first and second addressing means may also include a third counter defining the current index of a block in the branch with index i or i' and incremented each time that a block contains M or M' bytes, and intermediate calculation means calculating the address of each branch in the memory from the content of the first counter.

The first addressing means may further include first address determination means adapted to determine successive read and write addresses in the memory of data successively delivered to the interleaving means. The first address determination means determine the addresses from values supplied by the intermediate calculation means, the second and third counters and the parameter M.

The second addressing means may further include second address determination means adapted to determine successive read and write addresses in the memory of data successively delivered to the deinterleaving means. The second address determination means determine the addresses from values supplied by the intermediate calculation means, the second and third counters, the parameter M', and the size of the first memory space. This is so that the first unoccupied address in the memory can be determined.

BRIEF DESCRIPTION OF THE DRAWINGS

Other advantages and features of the invention will become apparent upon examining the following detailed description of non-limiting embodiments of the invention and the accompanying drawings, in which.

DETAILED DESCRIPTION OF THE PREFERRED EMBODIMENTS

Figure 1:
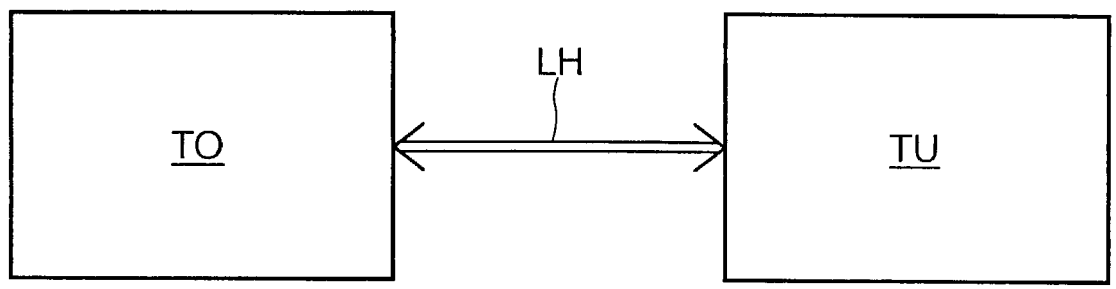
FIG. 1 is a schematic block diagram of a communication system in accordance with the invention linking two send/receive devices.

An application of the invention to a VDSL communication system will now be described, although the invention is not limited to this application. Referring to FIG. 1, two send/receive devices TO and TU according to the invention are shown, which may be referred to more simply as terminals or modems. One of these terminals, e.g., the terminal TO, is at the operator end. The other terminal TU is at the user end. The two modems are linked by a very high bit rate communication line LH.

The VDSL communication system enables the operator to provide symmetrical services, typically six symmetrical services S1-S6. That is, the information bit rates in the two transmission directions (i.e., from the operator to the user and from the user to the operator) are exactly the same. The service S1 with the lowest bit rate has a bit rate of 32×64 kbit/s, for example, and the fastest symmetrical service S6 has a bit rate of 362×64 kbit/s.

With the VDSL system, the operator can also provide asymmetrical services A1-A6. These are services with different information bit rates in the user to operator direction (uplink direction) and in the operator to user direction (downlink direction). The first asymmetrical service A1 has a bit rate in the uplink direction of 32×64 kbit/s, for example, and a bit rate in the downlink direction of 100×64 kbit/s. The asymmetrical service having the highest global information bit rate (uplink bit rate+downlink bit rate) is the service A6. The bit rate of the service A6 in the uplink direction is equal to 32×64 kbit/s and in the downlink direction is equal to 832×64 kbit/s.

The send/receive device according to the invention can therefore be installed at the user end or at the operator end and is capable of processing all the above services, as described in more detail hereinafter. Even so, the capacity of the memory assigned to the interleaving/deinterleaving means may need to be chosen in accordance with the maximum bit rate of the services offered, here the bit rate of the highest asymmetrical service (service A6). Furthermore, the parameters of the memory space of that memory may need to be set in accordance with the service actually processed by the device.

Figure 2:
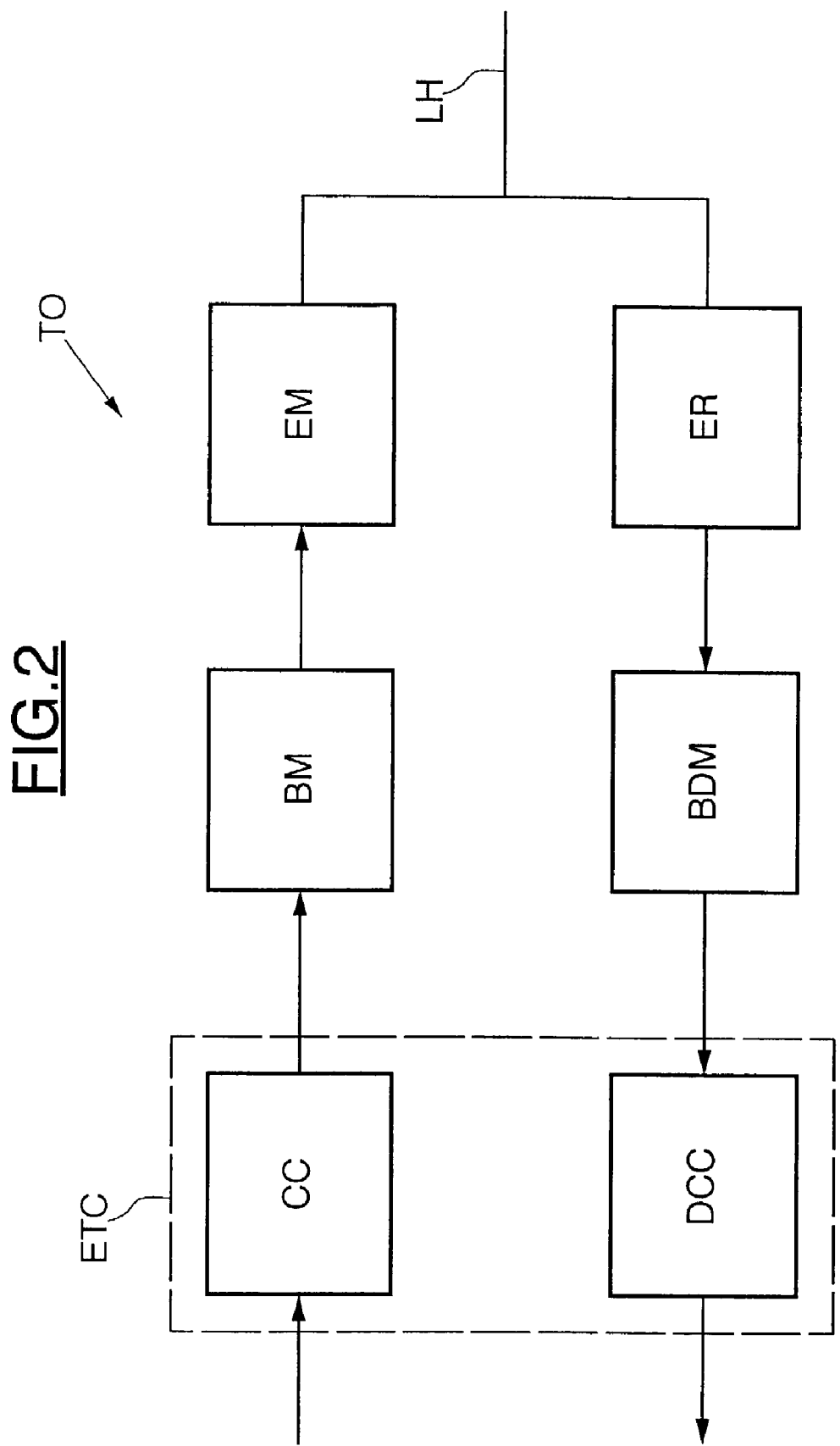
FIG. 2 is a more detailed schematic block diagram showing the internal architecture of a send/receive device according to the invention.

The internal architecture of the operator terminal TO from FIG. 1 will now be described in more detail. It should be understood that everything described hereinafter with respect to the operator terminal TO is equally valid for the terminal TU. The terminal TO includes a send system and a receive system both connected to the transmission line LH, as shown in FIG. 2. The terminal TO includes a channel coding/decoding stage ETC including a channel coding unit CC in the send system and a channel decoding unit DCC in the receive system.

The channel coding unit CC includes Reed-Solomon coding means whose structure and function are known to those of skill in the art. The Reed-Solomon coding means are associated with the interleaving means. In conjunction with subsequent interleaving, the Reed-Solomon coding can correct bursts of errors introduced by the transmission channel. Reed-Solomon coding is applied individually to each of the data packets delivered to the input of the coding unit CC.

Reed-Solomon coding adds a number of parity bytes to the bytes of the packets received and can therefore correct a number of erroneous bytes. It is assumed here, by way of example, that the Reed-Solomon code used is an RS (240, 224) code with a correcting power of 8. This notation means that the Reed-Solomon coding means are applied to packets of 224 bytes, to which they add 16 parity bytes, to form a Reed-Solomon coded word whose length is 240 bytes. This makes it possible to correct up to eight erroneous bytes.

Errors introduced by the channel, which often occur in bursts affecting several successive bytes and can therefore exceed the correction capacity of the Reed-Solomon code in isolation, may be distributed temporally. To do so, the bytes are temporally interleaved by modifying the order in which they are transmitted. This improves the efficacy of the Reed-Solomon coding.

The information delivered to the output of the channel coding stage ETC is delivered to a modulation unit BM whose structure is known in the art and which effects quadrature modulation, for example. Then, after various standard processes have been effected in a send unit EM, which includes an interface to the transmission line LH, the modulated signal is transmitted over the transmission line LH.

Similarly, the receive system of the terminal TO includes at its input a receive unit ER including a receive interface to the transmission line LH which effects standard processing. The modulated signal delivered to the output of the receive unit ER is demodulated in a demodulator unit BDM. The demodulated signal is then delivered to the channel decoding unit DCC. The latter unit includes deinterleaving and Reed-Solomon decoding means.

Figure 3:
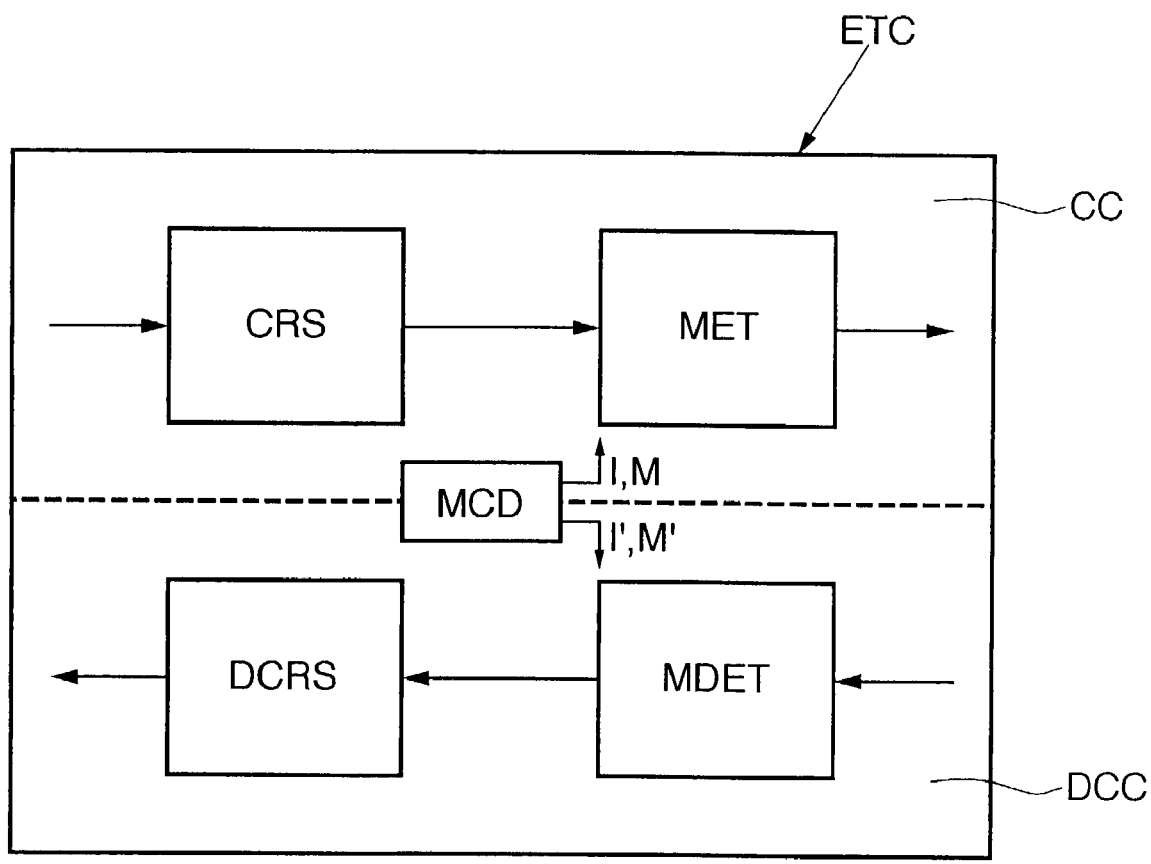
FIG. 3 is a schematic block diagram of the internal architecture of a coding/decoding stage of the device shown in FIG. 2.

The internal architecture and the operation of the interleaving and deinterleaving means will now be described in more detail with more particular reference to FIGS. 3-8. As shown in FIG. 3, and as already explained, the interleaving means MET follow the Reed-Solomon coding means CRS, and the deinterleaving means MDET precede the Reed-Solomon decoding means DCRS. As shown diagrammatically in FIGS. 4 and 5, the interleaving and deinterleaving are convolutional triangular interleaving and deinterleaving. There are I branches of i−1 blocks of M bytes for interleaving and I' branches of i'−1 blocks of M' bytes for deinterleaving.

As explained in more detail hereinafter, the parameters I, M, I' and M' can be modified, e.g., by software, and are delivered by control means MCD (see FIG. 3). The control means MCD may also be implemented in software. These parameters define the sizes of the respective memory spaces assigned to the interleaving means and to the deinterleaving means. This is done according to the bit rate of the information sent by the terminal TO (parameters I and M) and the bit rate of the information received by the terminal TO (parameters I' and M').

Figures 4, 5:
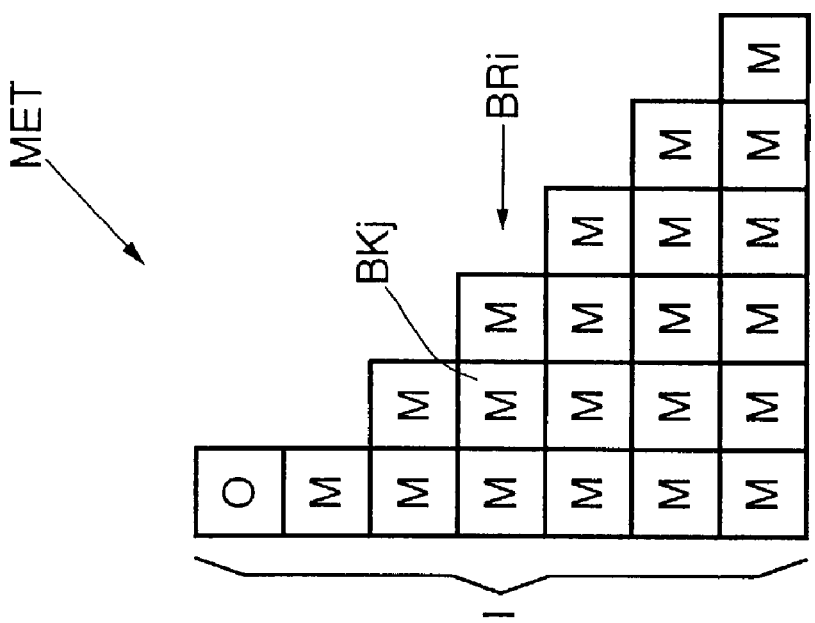
FIGS. 4 and 5 are schematic diagrams showing the theory of convolutional triangular interleaving and deinterleaving of the present invention.
Figure 6:
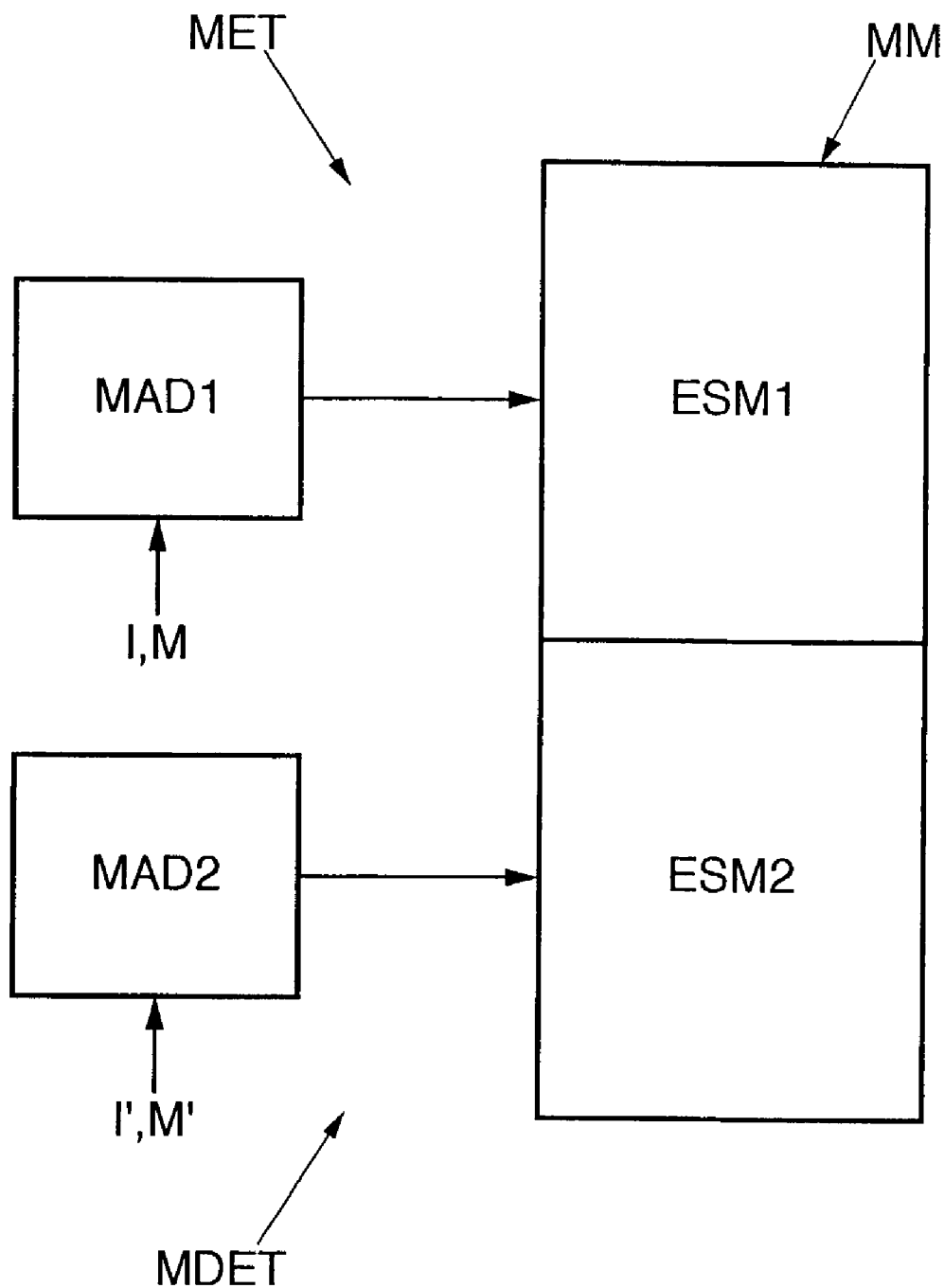
FIG. 6 is a schematic block diagram of the internal architecture of the interleaving and deinterleaving means of a send/receive device according to the invention.

The interleaving means therefore include I parallel branches BRi (numbered from 0 to I−1, for example) which are implemented with a delay increment of M per branch (M represents the maximum number of bytes of a block BKj with index j). Each branch can be considered as a delay line, the length of the branch with index i (where i varies in the range from 0 to I−1) being equal to i×M bytes. In FIG. 4, by way of example, I=7.

Accordingly, the first block of M bytes (having the index 0, for example) is not interleaved and is delivered unmodified to the output of the interleaving means. The next block of M bytes (index 1) is delivered to the input of the branch BR1, and so on up to the seventh block of M bytes (index 6), which is delivered to the branch BR6. The cycle then begins again with the blocks of bytes with indices from 7 to 13. The preceding blocks of bytes are either delivered to the output of the interleaving means or moved forward by one block BKj in the branch concerned.

The deinterleaving means associated with the interleaving means MET, and which are consequently incorporated into the user terminal TU, have a structure analogous to that which has just been described for the interleaving means. Yet, the indices of the branches are reversed so that the longest interleaving time-delay corresponds to the shortest deinterleaving time-delay. The deinterleaving means MDET incorporated in the operator terminal TO have I' branches, the branch with index i' having a length equal to i'×M' bytes.

For simplicity, the situation in which I'=I is shown in FIG. 5. However, if the service is an asymmetrical service, I and I' are generally different, of course, and likewise M and M'. In hardware terms, as shown diagrammatically in FIG. 6, the interleaving means and the deinterleaving means include common memory means MM, e.g., a dual-port random access memory. The memory space of the memory MM is then divided into a first memory space ESM1 assigned to the interleaving means MET, and a second memory space ESM2 is assigned to the deinterleaving means MDET.

The interleaving means also include first addressing means MAD1 receiving the parameters I and M. The deinterleaving means also include second addressing means MAD2 receiving the parameters I' and M'. The structure of the addressing means is described in more detail hereinafter with reference to FIGS. 7 and 8. The minimum size of the memory MM is set by the maximum bit rate that the send/receive device can process. The maximum bit rate is, of course, the sum of the uplink bit rate and the downlink bit rate.

In this example, the maximum bit rate is that of the largest asymmetrical service A6. An example of the capacity of the memory MM and of the values chosen for the parameters I, M, I' and M' for an asymmetrical service A6 and an RS (240, 224) Reed-Solomon code with a correction power of 8 bytes/word may be as follows when the transmission lines are disturbed by an impulsive noise with a duration of 0.25 ms.

In the downlink direction, the maximum bit rate is equal to 832×64 kbit/s. The number of bits affected by noise is consequently equal to the product of that bit rate by the duration of the impulsive noise, which yields a number of bits affected by noise equal to 13,312 (1,664 bytes). Given the correcting power of the Reed-Solomon code (here 8), the number nrs of Reed-Solomon words needed to correct 1,664 bytes subject to noise is equal to 1,664/8, i.e. 208. The size of the memory space needed to store this maximum bit rate is then equal to N×nrs/2, where N is the size of the Reed-Solomon code (here 240). The resulting memory space size is therefore equal to 24,960 bytes.

The bit rate in the uplink direction is equal to 32×64 kbit/s. A similar calculation shows that the number of bits affected by noise is equal to 512, and that nrs=8. The memory size to be provided for the uplink direction is therefore equal to 1,920 bytes. The minimum size of the memory MM is therefore 26,880 bytes.

The parameters I, I', M and M' can be determined from the above capacities. More particularly, the size of the first memory space needed to implement triangular convolutional interleaving with I branches of i−1 blocks of M bytes is equal to I×(I−1)×M/2. Similarly, the size of the second memory space ESM2 required to support the uplink bit rate is equal to I'×(I'−1)×M'/2. Also, I and I' must be sub-multiples of the size N of the Reed-Solomon code.

Since I×(I−1)×M/2 must be equal to 24,960, it is possible to choose I=40 and M=32. Similarly, because I'×(I'−1)×M'/2 must be at least equal to 1,920, it is possible to choose I'=24 and M'=7. This requires a slight increase in size to 1,932 to facilitate the implementation. The final size of the memory MM is therefore equal to 26 892 bytes.

The above calculation of I, M, I' and M' for the asymmetrical service A6 can be applied in an analogous manner to the other services of the VDSL system. A table of values for the parameters I, M, I' and M' can therefore be stored in the coding/decoding stage. When the modem is installed at the end of the line, and depending on the service actually provided by the operator, the control means MCD may retrieve the corresponding values of I, M, I' and M' from the stored table. These values are delivered to the addressing means MAD1 and MAD2, the structure of which is described in more detail with reference to FIGS. 7 and 8.

Figure 7:
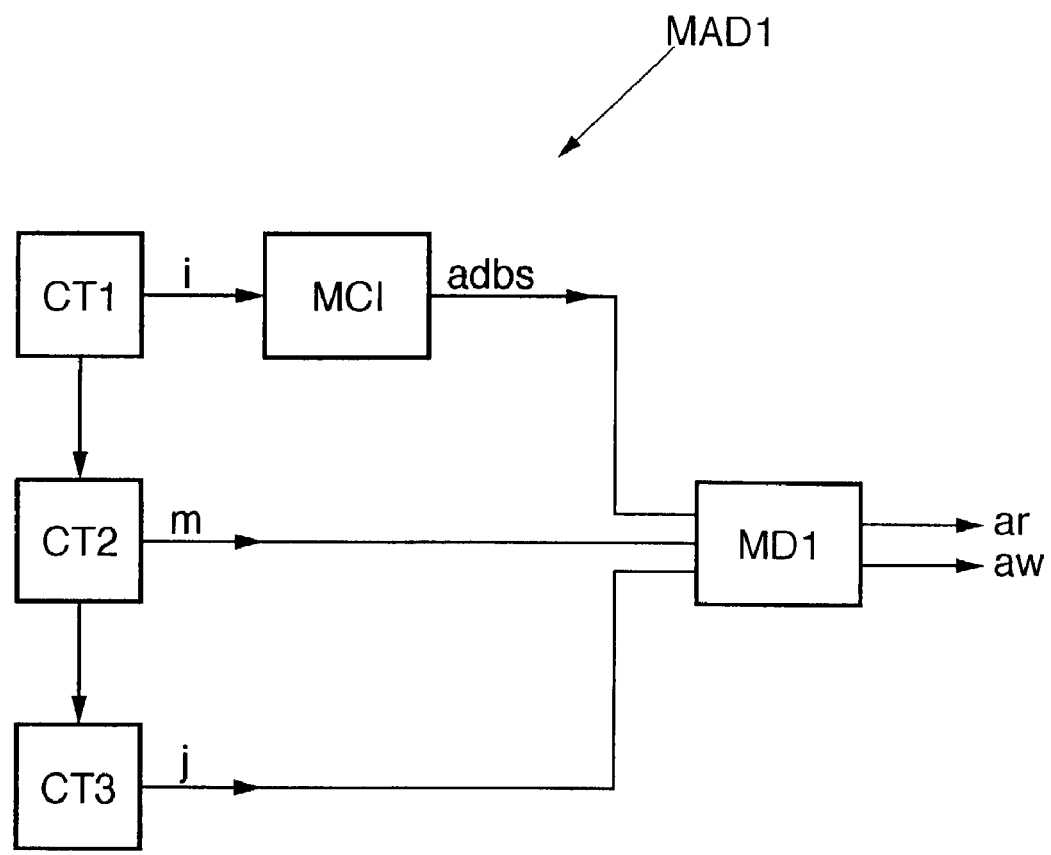
FIG. 7 is a schematic block diagram of an embodiment of first addressing means associated with the interleaving means.
Figure 8:
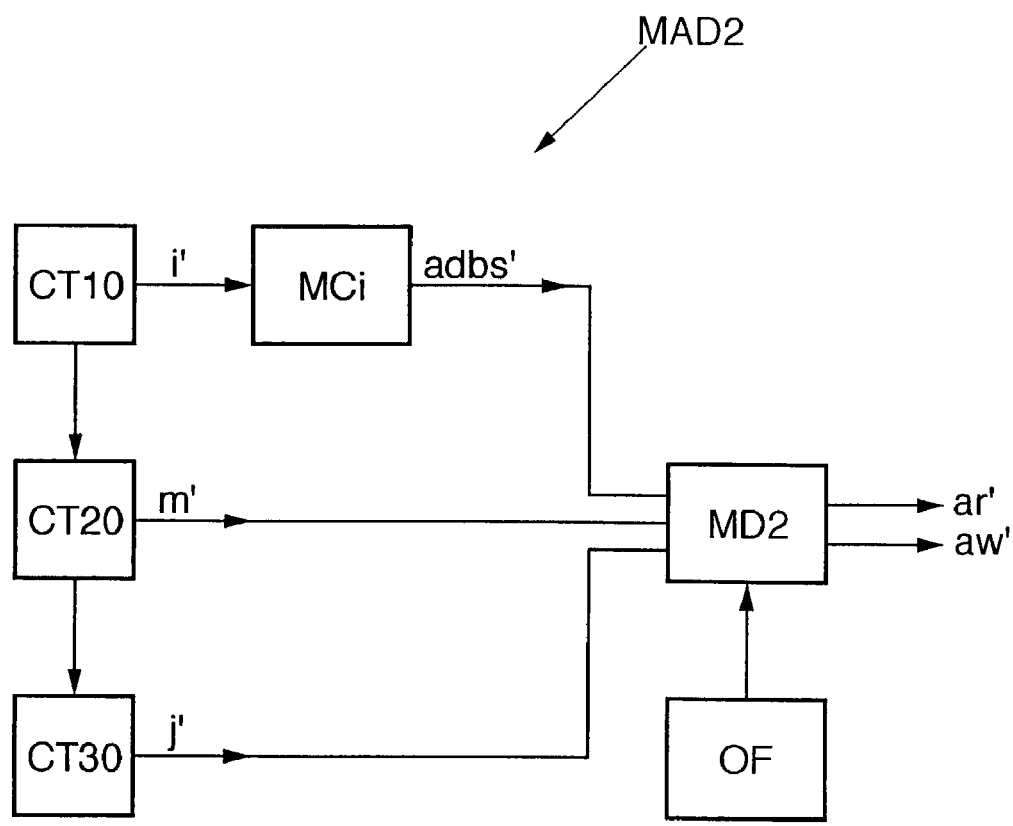
FIG. 8 is a schematic block diagram of an embodiment of the second addressing means associated with the deinterleaving means.

As shown in FIG. 7, the first addressing means include a first counter CT1 delivering the relative index i of a branch BRi at the timing rate of a clock signal. The index i is delivered to intermediate calculation means MCI that determine the address adbs of the branch BRi in the first memory space. More specifically, the address adbs is equal to i×(i−

1)/2. The means MCI can be easily implemented using multipliers, dividers and subtractors.

The first counter CTI has a counting range equal to I and therefore counts from 0 to I−1, for example. The means MD1 further include a second counter CT2 which delivers a current value m equal to the current number of bytes in each block BKj of a branch BRi. The counting range of the counter CT2 is equal to M. In other words, m can vary from 0 to M−1, for example. The second counter CT2 is incremented by one unit each time that i=I−1.

The means MDA1 further include a third counter CT3 which delivers the index j of the block BKj within the branch with index i. The counting range of the counter CT3 is equal to i. In other words, j varies from 0 to i−1, for example. The third counter CT3 is incremented each time that a block contains M bytes, and therefore in this example each time that the counter CT2 reaches the value M.

The means MDA1 further include first address determination means MD1 which determine the read address ar in the memory and the write address aw in the memory. More precisely, the read address ar is equal to (adbs+j)×M+m. The write address aw is then simply equal to the read address but delayed by one cycle of the clock signal. Again, the means MD1 can be easily implemented using adders and multipliers.

For example, a small auxiliary dual-port memory with a capacity of (I−1)×M bits can be used to store the value of the index j delivered by the third counter CT3, which is incremented every M clock cycles. Every M clock cycles, the value of j corresponds to the ith branch in the auxiliary memory, after which the counter CT3 is incremented and the new value is rewritten at the same address.

The second addressing means MDA2 that deliver the read address ar' and the write address aw' in the second memory space of the memory MM have a structure similar to that just described for the first addressing means MDA1. Only the differences between the means MDA1 and the means MDA2 are described herein. The first counter CT10 delivers the relative index i' of a branch. This time i' varies in the range of I'−1 to 0. The intermediate calculation means MCI deliver the address of each branch adbs' using a formula analogous to that used to calculate the address, but substituting i' for i.

The second counter CT20 defines the number m' of bytes in a block and is incremented each time that the counter CT10 reaches its counting limit value, in this example when i' reaches the value 0. In this example, the second counter CT20 varies in the range from 0 to M'−1. The third counter CT30 defines the current index j' of a block in the branch with index i'. It varies in the range from 0 to i'−1 and is incremented each time that a block contains M' bytes, i.e., when the second counter CT20 reaches the value M'.

The second addressing means MDA2 include second address determination means MD2 which determine the write address aw' and the read address ar'. However, the second address determination means MD2 must allow for the size OF of the first memory space ESM1, which is defined by equation (1) below:

$$OF = I \times (I-1) \times M/2, \quad (1)$$

and may be stored in a register, for example. For uplink interleaving, the addresses of the memory MM vary in the range of 0 to OF−1.

The first unoccupied address in the memory MM therefore has the value OF. The means MD2 then calculate the read address ar' from equation (2) below:

$$ar' = OF + M' \times (adbs' + j') + m'. \quad (2)$$

The write address aw' is equal to the read address and is available on the next clock pulse.

Of course, everything just described here for the terminal TO applies to the terminal TU with deinterleaving means with I branches and interleaving means with I' branches. For the user terminal TU it is then necessary to substitute I' for I, and vice versa, and M' for M, and vice versa, in the foregoing description. It would equally be possible to use a single-port memory in place of a dual-port memory by adopting a clock signal having twice the frequency.

That which is claimed is:

1. A device for sending and receiving digital data that is capable of processing different bit rates from a group of predetermined bit rates, the device comprising:
   a channel coding/decoding stage comprising
   an interleaver,
   a deinterleaver,
   a shared memory having a minimum size based upon a maximum bit rate of the group of predetermined bit rates and having a first memory space assigned to said interleaver and a second memory space assigned to said deinterleaver, a size of each of the first and second memory spaces being set as a function of the bit rate actually processed by the device,
   a Reed-Solomon coder/decoder connected to said interleaver and said deinterleaver and having a length N, and
   said interleaver providing convolutional interleaving of I branches with i−1 blocks of M bytes, and said deinterleaver providing convolutional deinterleaving with I' branches of i'−1 blocks of M' bytes, with I and I' being sub-multiples of N and i and i' being current relative indexes of the branches.

2. The device according to claim 1 wherein the size of the first memory space is equal to I×(I−1)×M/2 bytes, the size of the second memory space is equal to I'×(I'−1)×M'/2 bytes, and the sizes of the first and second memory spaces are set by I, I', M and M'.

3. The device according to claim 1 wherein said interleaver and said deinterleaver respectively comprise a first addressing device and a second addressing device, said first and second addressing devices each comprising:
   a first counter defining the relative index i or i' of a branch and having a counting limit value;
   a second counter defining a number of bytes in a block and incremented each time that said first counter reaches its counting limit value;
   a third counter defining the current index of a block in the branch with index i or i' to be incremented each time the block in the branch with index i or i' has M or M' bytes; and
   an intermediate calculation device for calculating the address of each branch in said memory from the content of said first counter.

4. The device according to claim 3 wherein said first addressing device further comprises a first address determination device for determining successive read and write addresses in said memory of data successively delivered to said interleaver and said first address determination device, the successive read and write addresses being determined based upon values supplied by said intermediate calculation device, said second and third counters, and the parameter M.

5. The device according to claim 3 wherein said second addressing device further comprises a second address determination device for determining successive read and write addresses in said memory of data successively delivered to said deinterleaver and said second address determination device, the successive read and write addresses being determined based upon values supplied by said intermediate calculation device, said second and third counters, the parameter M', and the size of the first memory space.

6. The device according to claim 1 wherein said memory comprises a random access memory.

7. The device according to claim 1 wherein said memory comprises a dual-port memory.

8. A device for sending and receiving digital data that is capable of processing different bit rates from a group of predetermined bit rates, the device comprising:
a channel coding/decoding stage comprising
an interleaver,
a deinterleaver,
a shared random access memory whose minimum size is fixed as a function of a maximum bit rate of the group of predetermined bits and having a first memory space assigned to said interleaver and a second memory space assigned to said deinterleaver, a size of each of the first and second memory spaces being set as a function of the bit rate actually processed by the device, and
a Reed-Solomon coder/decoder connected to said interleaver and said deinterleaver and having a length N,
said interleaver providing convolutional interleaving of I branches with i−1 blocks of M bytes, and said deinterleaver providing convolutional deinterleaving with I' branches of i'−1 blocks of M' bytes, with I and I' being sub-multiples of N and i and i' being current relative indexes of the branches, said interleaver and said deinterleaver respectively comprising a first addressing device and a second addressing device, said first and second addressing devices each comprising
a first counter defining the relative index i or i' of a branch and having a counting limit value,
a second counter defining a number of bytes in a block and incremented each time that said first counter reaches its counting limit value,
a third counter defining the current index of a block in the branch with index i or i' to be incremented each time the block in the branch with index i or i' has M or M' bytes, and
an intermediate calculation device for calculating the address of each branch in said random access memory from the content of said first counter.

9. The device according to claim 8 wherein the size of the first memory space is equal to I×(I−1)×M/2 bytes, the size of the second memory space is equal to I'×(I'−1)×M'/2 bytes, and the sizes of the first and second memory spaces are set by I, I', M and M'.

10. The device according to claim 8 wherein said first addressing device further comprises a first address determination device for determining successive read and write addresses in said random access memory of data successively delivered to said interleaver and said first address determination device, the successive read and write addresses being determined based upon values supplied by said intermediate calculation device, said second and third counters, and the parameter M.

11. The device according to claim 8 wherein said second addressing device further comprises a second address determination device for determining successive read and write addresses in said random access memory of data successively delivered to said deinterleaver and said second address determination device, the successive read and write addresses being determined based upon values supplied by said intermediate calculation device, said second and third counters, the parameter M', and the size of the first memory space.

12. The device according to claim 8 wherein said random access memory comprises a dual-port memory.

13. A method for sending and receiving digital data and processing different bit rates from a group of predetermined bit rates, the method comprising:
interleaving and deinterleaving the digital data;
setting a minimum size of a shared memory based upon a maximum bit rate of the group of predetermined bit rates;
assigning a first memory space of the shared memory for interleaving and a second memory space of the shared memory for deinterleaving, a size of each of the first and second memory spaces being set as a function of the bit rate actually processed by the device;
performing Reed-Solomon coding and decoding for a length N of the digital data; and
the interleaving providing convolutional interleaving of I branches with i−1 blocks of M bytes, and the deinterleaving providing convolutional deinterleaving with I' branches of i'−1 blocks of M' bytes, with I and I' being sub-multiples of N and i and i' being current relative indexes of the branches.

14. The method according to claim 13 wherein the size of the first memory space is equal to I×(I'−1)×M/2 bytes, the size of the second memory space is equal to I'×(I'−1)×M'/2 bytes, and the sizes of the first and second memory spaces are set by I, I', M and M'.

15. The method according to claim 13 wherein the memory comprises a random access memory.

* * * * *

UNITED STATES PATENT AND TRADEMARK OFFICE
CERTIFICATE OF CORRECTION

PATENT NO. : 7,269,208 B2  
APPLICATION NO. : 10/088387  
DATED : September 11, 2007  
INVENTOR(S) : Mazzoni et al.

It is certified that error appears in the above-identified patent and that said Letters Patent is hereby corrected as shown below:

Column 2, Line 41    Delete: "N"  
                     Insert: -- M --

Column 10, Line 44   Delete: "I × (I' - 1) × M/2"  
                     Insert: -- I × (I - 1) × M/2 --

Signed and Sealed this

Twentieth Day of May, 2008

JON W. DUDAS  
*Director of the United States Patent and Trademark Office*